(12) United States Patent
Carpenter et al.

(10) Patent No.: US 7,105,208 B2
(45) Date of Patent: Sep. 12, 2006

(54) METHODS AND PROCESSES UTILIZING MICROWAVE EXCITATION

(75) Inventors: Craig M. Carpenter, Boise, ID (US); Ross S. Dando, Nampa, ID (US); Philip H. Campbell, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 10/699,013

(22) Filed: Oct. 30, 2003

(65) Prior Publication Data
US 2004/0089233 A1 May 13, 2004

Related U.S. Application Data

(62) Division of application No. 10/121,320, filed on Apr. 11, 2002, now Pat. No. 6,845,734.

(51) Int. Cl.
*H05H 1/30* (2006.01)
(52) U.S. Cl. .......................... 427/575; 427/595
(58) Field of Classification Search ............... 427/575, 427/569, 595
See application file for complete search history.

(56) References Cited

U.S. PATENT DOCUMENTS

| | | | |
|---|---|---|---|
| 4,778,561 A * | 10/1988 | Ghanbari | 216/70 |
| 5,134,965 A | 8/1992 | Tokuda et al. | |
| 5,327,150 A * | 7/1994 | Cherrette | 343/771 |
| 5,545,258 A | 8/1996 | Katayama et al. | |
| 5,645,644 A | 7/1997 | Mabuchi et al. | |
| 5,653,841 A * | 8/1997 | Krishnamurthy et al. | 156/150 |
| 5,698,036 A * | 12/1997 | Ishii et al. | 118/723 MW |
| 5,749,966 A * | 5/1998 | Shates | 117/79 |
| 5,788,778 A | 8/1998 | Shang et al. | |
| 5,951,887 A | 9/1999 | Mabuchi et al. | |
| 5,988,104 A | 11/1999 | Nambu | |
| 6,040,021 A * | 3/2000 | Miyamoto | 427/576 |
| 6,133,807 A * | 10/2000 | Akiyama et al. | 333/101 |
| 6,158,383 A | 12/2000 | Watanabe et al. | |
| 6,311,638 B1 | 11/2001 | Ishii et al. | |
| 6,347,602 B1 | 2/2002 | Goto et al. | |
| 6,416,822 B1 * | 7/2002 | Chiang et al. | 427/561 |
| 6,446,573 B1 | 9/2002 | Hirayama et al. | |
| 6,454,912 B1 * | 9/2002 | Ahn et al. | 204/192.15 |
| 6,527,908 B1 | 3/2003 | Kanetsuki et al. | |

FOREIGN PATENT DOCUMENTS

EP 0 520 832 A1 12/1992
EP 1 115 147 A1 7/2001

* cited by examiner

*Primary Examiner*—Bret Chen
(74) *Attorney, Agent, or Firm*—Wells St. John P.S.

(57) ABSTRACT

The invention includes methods and processes in which microwave radiation is utilized to activate at least one component within a reaction chamber during deposition of a material over a substrate within the reaction chamber.

43 Claims, 3 Drawing Sheets

METHODS AND PROCESSES UTILIZING MICROWAVE EXCITATION

RELATED PATENT DATA

This patent resulted from a divisional of U.S. patent application Ser. No. 10/121,320, which was filed Apr. 11, 2002, now U.S. Pat. No. 6,845,734.

TECHNICAL FIELD

The invention pertains to deposition methods utilizing microwave excitation, and in particular applications pertains to chemical vapor deposition (CVD) methods and atomic layer deposition (ALD) methods. The invention also pertains to apparatuses which can be utilized for deposition methods.

BACKGROUND OF THE INVENTION

Semiconductor processing in the fabrication of integrated circuitry involves the deposition of layers on semiconductor substrates. Exemplary processes include chemical vapor deposition (CVD) and atomic layer deposition (CVD). CVD and ALD can be conducted within chambers or reactors which retain a single substrate upon a wafer holder or susceptor. One or more precursor gasses are typically provided to a shower head within the chamber which is intended to uniformly provide the reactant gasses substantially homogeneously over the outer surface of the wafer. The precursors react or otherwise manifest in a deposition of a suitable layer atop the substrate. Plasma enhancement may or may not be utilized. If plasma enhancement is utilized, the plasma can be generated and maintained either directly within the chamber or remotely therefrom.

In certain deposition processes, including ALD and CVD, it can be desirable to provide activated species within a reaction chamber. The activated species can be formed from a non-activated component by exposing the component to an energy that the component can absorb. Upon absorbing the energy, an energy state of the component can be lifted so that the component becomes energetically excited, and accordingly becomes an activated species.

One method of providing an activated species within a reaction chamber is to generate the species remotely from the chamber and subsequently flow the species into the chamber. The remote generation can allow a specific apparatus to be set up for generation of the activated species, which can be much simpler than attempting to generate an activated species within a reaction chamber. However, a problem with remote generation is that an activated species can become deactivated and/or recombined in route from the apparatus in which it is generated to a reaction chamber. It is therefore desirable to develop new methods for providing activated species in reaction chambers, and to develop apparatusses suitable for the methods.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY OF THE INVENTION

In one aspect, the invention includes a deposition method which comprises microwave excitation of a component within a reaction chamber during deposition of a material over a substrate within the reaction chamber.

In one aspect, the invention includes a deposition method wherein an apparatus is provided which comprises a reaction chamber and a microwave source external to the chamber. The reaction chamber includes a window through which microwave radiation can pass. A substrate is placed within the reaction chamber, and one or more microwave-inducible constituents is flowed into the reaction chamber. Also, one or more precursors are flowed into the reaction chamber. While the substrate and the one or more microwave-inducible constituents are within the reaction chamber, at least one of the microwave-inducible constituents is activated with microwave radiation to form at least one activated species (such activation can include molecular fragmentation). At least one of the one or more precursors is reacted with the activated species, and at least a component of the at least one of the more precursors is deposited onto the substrate.

In one aspect, the invention encompasses a deposition apparatus which includes a reaction chamber, and a microwave source external to the chamber. The microwave source is configured to direct microwave radiation toward the chamber. The chamber includes a window through which microwave radiation from the microwave source can pass into the chamber.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
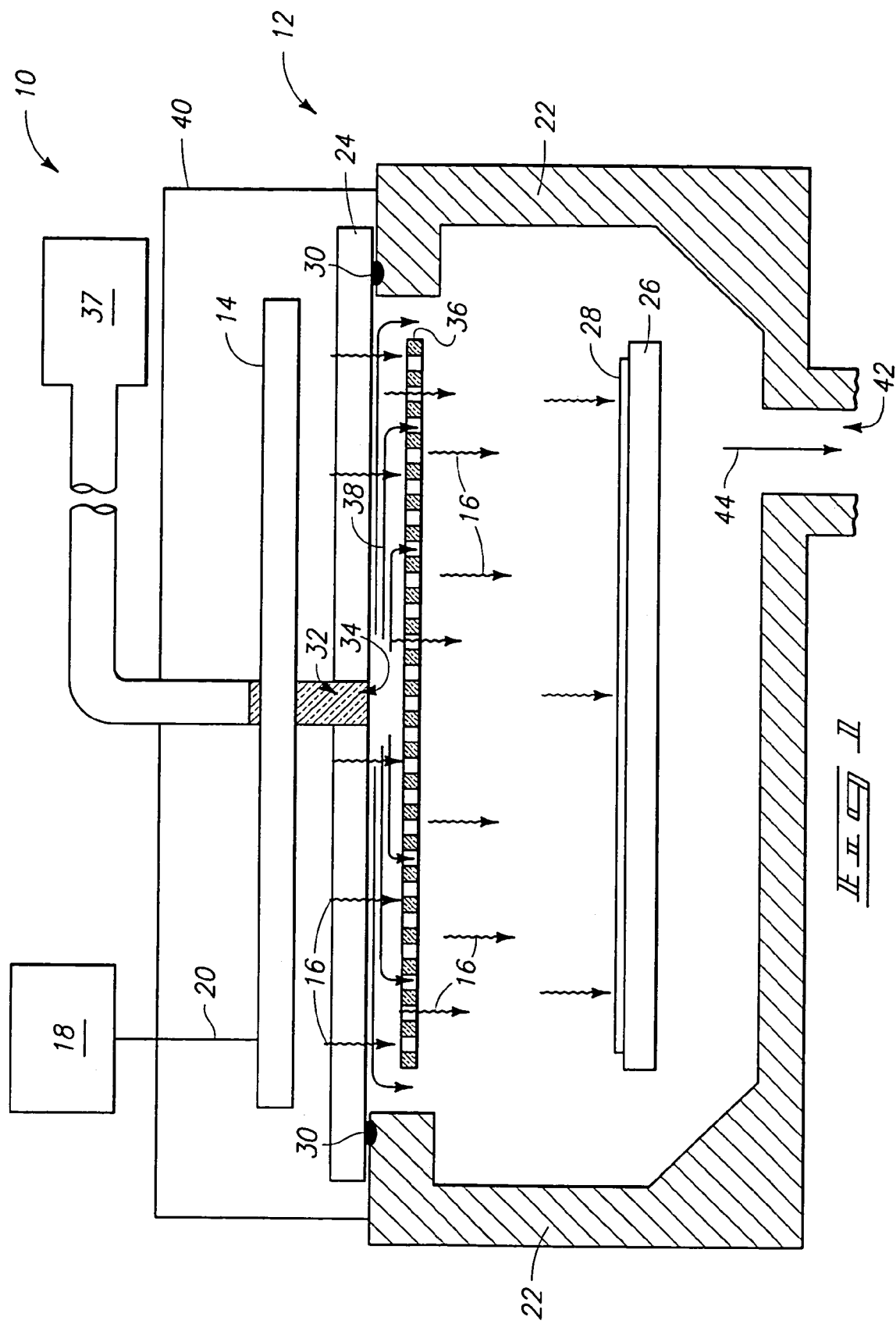
FIG. 1 is a diagrammatic cross-sectional view of an apparatus which can be utilized in particular aspects of the invention.

In particular aspects, the present application pertains to atomic layer deposition (ALD) technology. ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

The deposition methods herein are described in the context of formation of materials on one or more semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements along with the portions of Groups IIIA to VIA designated as metals in the periodic table, namely, Al, Ga, In, TI, Ge, Sn, Pb, Sb, Bi, and Po. The Lanthanides and Actinides are included as part of Group IIIB. "Non-metals" refers to the remaining elements of the periodic table.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than One monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within an frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate.

In particular aspects, the invention encompasses methods of imparting microwave excitation to components within a reaction chamber during CVD or ALD processes. An apparatus which can be utilized in such methodology is illustrated in FIG. 1 as apparatus 10.

Apparatus 10 comprises a reaction chamber 12 and a microwave source 14. The microwave source is configured to direct microwaves (illustrated by wavy lines 16, only some of which are labeled) toward reaction chamber 12. Microwaves are to be understood as radiation having a wavelength of from about 10 cm to about 0.1 cm.

Microwave source 14 can comprise, for example, a phased array antenna, or other configurations configured to emit a phased array of microwave radiation. Microwave source 14 can generate microwaves, or can be utilized to direct microwaves that have been generated remotely from source 14.

Microwave source 14 is shown electrically connected with a microwave generator and/or power controller 18 through an interconnect 20. Microwave generator and/or power controller 18 can be utilized to adjust the phase of microwaves generated along different portions of the expanse of source 14. For instance, microwaves at one portion of the expanse of source 14 can be tuned differently relative to microwaves along another portion of the expanse to generate sweeping waves of microwave radiation. Additionally and/or alternatively, controller and/or generator 18 can be utilized for emitting timed pulses of microwave radiation from source 14.

Reaction chamber 12 comprises a wall 22 extending around the majority of the reaction chamber periphery. Wall 22 can be formed of, for example, appropriate metals. Reaction chamber 12 also comprises a window 24 extending across a portion of the reaction chamber proximate microwave source 14. Window 24 comprises a material at least partially transparent to microwave radiation, and in particular applications can comprise, consist essentially of, or consist of one or more of quartz, mica and some plastics. In operation, microwave radiation 16 passes from source 14 through window 24 and into chamber 12.

A substrate holder 26 is provided within chamber 12, and such retains a substrate 28 within the chamber. Substrate 28 can comprise, for example, a semiconductor wafer substrate. In the shown embodiment, substrate 28 is within a path of the microwave radiation 16 directed into chamber 12.

Substrate holder 26 would typically be mounted within chamber 12 with various support structures to retain holder 26 within a desired location of chamber 22. The supporting structures are not shown in the schematic diagram of FIG. 1 to simplify the illustration.

Substrate holder 26 can be configured to regulate a temperature of the substrate 28 retained by holder 26. Accordingly, substrate holder 26 can comprise a heater utilized for heating the retained substrate. Additionally and/or alternatively, holder 26 can be coupled with a cooling apparatus and utilized for cooling a substrate retained thereby. It is also possible that a temperature regulating mechanism can be provided in addition to wafer holder 26, and holder 26 can be utilized for thermal conduction between substrate 28 and the temperature regulating mechanism.

In the shown application, window 24 is at a top of chamber 12 and substrate holder 26 is provided beneath the window. It is to be understood that the invention can encompass other applications in which the window is additionally and/or alternatively provided along a side or bottom of chamber 12, and in which a microwave source is also alternatively and/or additionally provided along either a side or bottom of the reaction chamber. However, the shown application of the invention can be a preferred application, in that a substrate 28 can be provided in a path of microwave radiation directed into chamber 12, and can be retained on holder 26 via gravity.

It can be advantageous to connect window 24 to sidewalls 22 through an elastomeric material 30 due to differences in the thermal expansion of window 24 relative to sidewalls 22. The elastomeric material is preferably compatible with process chemistries utilized within chamber 12 and can comprise, for example, silicone-based materials.

Apparatus 10 comprises an inlet port 32 extending through microwave source 14, and also through window 14. Port 32 can comprise, for example, quartz. Inlet port 32 terminates in an opening 34 beneath window 24, and is in fluid connection with a source 37 of one or more materials which are to be flowed into chamber 12. It should be understood that even though only one inlet port and source are shown in the apparatus 10 of FIG. 1, numerous inlet ports can be provided, and the various inlet ports can be in connection with more than one source of material.

Reaction chamber 12 has an outlet 42 extending therein, and in operation materials flow into chamber 12 from inlet port 32, and then flow out of the chamber through outlet 42. A pump can be provided relative to outlet 42 to aid in withdrawing materials from within chamber 12, and such can be particularly useful in ALD applications in which one or more materials are to be pulsed into and out of chamber 12. Materials exiting from chamber 12 are illustrated diagrammatically with an arrow 44. Although only one outlet is illustrated, it is to be understood that additional outlets can be provided.

A gas dispersion plate 36 (or diffuser) is provided beneath inlet port 32. Plate 36 has a plurality of openings extending therethrough to allow gaseous material (illustrated diagrammatically by arrows 38, only one of which is labeled) to flow through the gas dispersion plate. Accordingly, gaseous materials entering chamber 22 through inlet port 32 flow across and through gas dispersion plate 36. The gas dispersion plate is preferably formed of material which is at least partially transparent to microwave radiation, and can, in particular applications, comprise, consist essentially of, or consist of quartz, mica or plastic. Gas dispersion plate 36 can be held within a desired orientation in chamber 12 utilizing various support structures (not shown).

A radio frequency (RF) shield (or cover) 40 is provided over and around microwave source 14 to alleviate or prevent stray microwave radiation from being scattered into an environment proximate apparatus 10. In the shown embodiment, source 37 is external to cover 40, and accordingly materials are flowed from source 37 through cover 40 and into chamber 12. The invention can encompass other applications in which source 37 is provided beneath the RF shield.

In operation, the materials flowed into chamber 12 preferably comprise at least one component which can be excited with microwave radiation. Components which can be excited with microwave radiation can be referred to as microwave-inducible constituents. Exemplary microwave-inducible constituents include O, H and N. Such constituents can be flowed into chamber 12 as diatomic species (specifically, $O_2$, $H_2$, and $N_2$), or as other species. The microwave-induced constituents flow through the microwave radiation 16 from source 14, and can thereby be activated to form at least one microwave excited component (which can also be referred to as an activated species). The activated species can, in particular applications, define a plasma generated by the microwave radiation. In other applications, the activated species can be non-plasma species. In any event, the microwave excitation of the various components can enhance reactivity of the components.

The microwave excited components can deposit onto substrate 28 to form a layer on the substrate. For instance, if oxygen is a microwave activated component within chamber 12, the activated oxygen can interact with a material on substrate 28 to form an oxide. In exemplary applications, substrate 28 can comprise a metal-containing surface (such as, for example, a titanium-containing surface), and activated oxygen can react with such surface to form a metal oxide (such as, for example, titanium oxide). In other applications, the microwave excited component can comprise nitrogen, and such component can react with a material on the upper surface of substrate 28 (such as metal, with an exemplary metal being titanium) to form a nitride species across the upper surface (such as, for example, a metal nitride, with an exemplary metal nitride being titanium nitride).

In applications in which a microwave excited component reacts directly with a surface of substrate 28, the component can be on or otherwise associated with a surface of the substrate as the component is subjected to the microwave excitation. Such can be advantageous in applications in which a microwave excited component has a very short lifetime.

In particular applications, various precursors can be flowed into reaction chamber 12 in addition to the microwave-inducible constituents. The precursors can react with microwave excited components of the microwave-inducible constituents to form materials which ultimately deposit over a surface of substrate 28.

The precursors can comprise, for example, metallo-organic materials and can react with the microwave excited components to generate metals which ultimately deposit over a surface of substrate 28. If the precursors comprise metallo-organic precursors, the precursors can bond to a surface of substrate 28 prior to reacting with the microwave excited components and/or can react with the microwave-excited components to form metallic materials which thereafter accumulate on substrate 28.

In an exemplary application, the microwave excited component can comprise O, and such can react with a metallo-organic precursor to oxidize the organic component of the precursor and cleave such from the metallic component which thereafter accumulates on a surface of substrate 28. Alternatively, the metallo-organic precursor can bond to an upper surface of substrate 28 prior to reaction with the O, and the O can thereafter cleave the organic component of the precursor to leave the metal as a deposit over a surface of substrate 28. In further aspects of the invention, the oxygen can react with the metal either during or after the cleavage of the organic material, to form a metal oxide which ultimately accumulates as a deposit over a surface of substrate 28. Similarly, if the microwave excited component is N, such can form a metal nitride over a surface of substrate 28. If the microwave excited component is H, such can reduce various portions of a precursor to leave a component of the precursor which ultimately deposits over a surface of substrate 28.

If the microwave excited component is part of a plasma, such can be utilized in combination with plasma-enhanced chemical vapor deposition, or can be utilized for dry etching of various materials associated with substrate 28.

It is noted that the microwave excited component can be provided as part of a compound which includes other atoms in addition to the microwave-excited component. The component can cleave from the compound as a result of the microwave activation and/or as a result of reacting with precursors within the reaction chamber, and can thereafter be incorporated into a deposit over a surface of substrate 28. Accordingly, the deposited material over substrate 28 can comprise a product which includes at least a portion of a microwave excited component formed within chamber 12.

In applications in which an activated species is formed by microwave excitation of a constituent, and in which the activated species reacts with one or more precursors to form one or more components which are deposited over substrate 28, the reacting with the precursors can occur before, after, or during deposition of the components onto a surface of substrate 28.

The reaction of the activated species with the precursor can break the precursor to form a fragment of the precursor which is ultimately deposited onto substrate 28 (such as, for example, can break a metallo-organic precursor into a metal-containing fragment which is ultimately deposited onto substrate 28). Accordingly, a material deposited over substrate 28 can comprise a fragment of a precursor rather than an entirety of a precursor, in particular applications. Further, the microwave activated component can react with the fragment to form a new species which deposits over substrate 28, such as, for example, in applications in which the microwave activated component comprises oxygen or nitrogen, and reacts with a metal-containing precursor to form a metal oxide or metal nitride which is ultimately deposited over substrate 28.

The methodology described herein can be utilized in, for example, CVD or ALD applications. If the methodology is utilized in ALD applications, a particular reaction sequence can comprise pulsing a first component into reaction chamber and forming a monolayer over a substrate from the first component. The first component is then purged from the reaction chamber and a second component is thereafter pulsed into the reaction chamber to form a second monolayer over the monolayer formed from the first component. Subsequently, the second component can be purged from the reaction chamber, and the first component can thereafter be again pulsed into the reaction chamber to form another monolayer over the monolayer formed from the second component. Accordingly, the first and second components can be sequentially pulsed and purged from the reaction chamber.

A microwave activated species can be formed from one or both of the first and second components during the pulsing of the components into the reaction chamber, or can be formed in addition to one or both of the first and second components as the components are pulsed into the reaction chamber. In any event, it can be advantageous for a microwave pulse utilized during an ALD process to be approximately as quick as a sequential pulse of a component into the reaction chamber. In other words, if a pulse of a component into a reaction chamber is about 2 seconds, it can be advantageous for the microwave pulse to be also about 2 seconds so that the pulse of microwave radiation can substantially coincide with the pulse of the component (with the term "substantially" coincide being utilized to indicate that the two pulses coincide within errors of detection). Such can be particularly advantageous if only one of the pulses associated with an ALD process is to be microwave induced, and the other pulse is not. In such applications, it can be desired to utilize a microwave source with a very rapid response time. Suitable microwave sources are, for example, phased array antennas with appropriate microwave generators and controllers.

Figure 2:
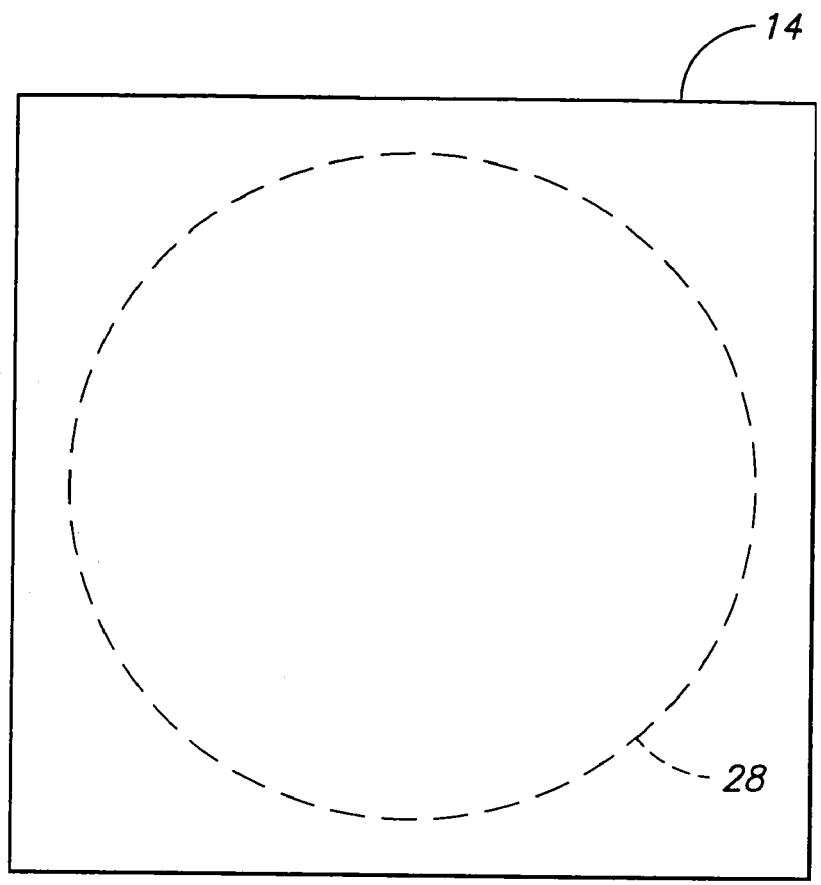
FIG. 2 is a diagrammatic top view illustrating an exemplary relationship of a microwave source relative to a substrate in a particular aspect of the present invention.

The microwave source 14 utilized in various aspects of the invention can be an antenna which extends across an entirety of the substrate 28. For instance, FIG. 2 illustrates an exemplary source 14 (the periphery of which is shown with a solid line), superimposed over an exemplary substrate 28 (the periphery of which is shown by a dashed line). The microwave source 14 extends across an entirety of a surface of substrate 28, and accordingly microwave radiation from source 14 can simultaneously be directed across the entirety of substrate 28. Although the shown microwave source 14 has a rectangular shape, it is to be understood that the microwave source can have other shapes, such as, for example, a circular shape.

Figure 3:
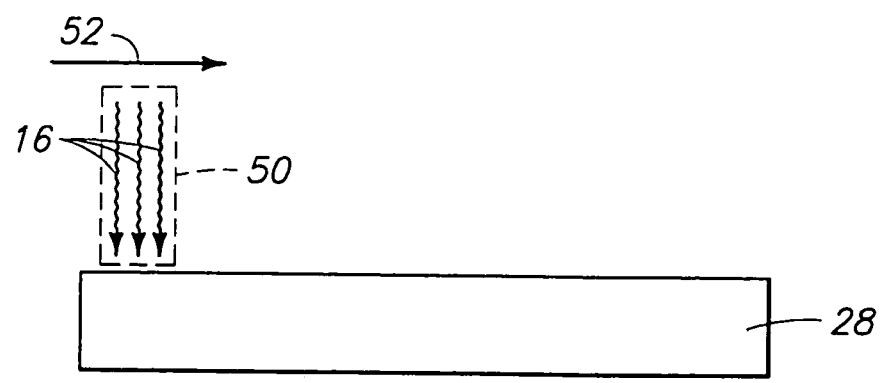
FIG. 3 is a diagrammatic side view of a substrate treated with microwave radiation in accordance with an aspect of the present invention, and illustrates an exemplary direction of travel of a microwave beam.

Microwave radiation emitted from source 14 can impact a surface of substrate 28, and such can be useful in applications in which activated species having relatively short lifetimes are formed from the microwave radiation and utilized for CVD or ALD processes. If a phased array antenna is utilized as the microwave source, an orientation of the microwave radiation relative to substrate 28 can be controlled. Such is illustrated in FIG. 3 wherein a substrate 28 is illustrated in cross-sectional view, together with a beam 50 (schematically illustrated with a dashed box) of microwave radiation 16. The beam of microwave radiation 16 is swept linearly across substrate 28 as illustrated by an arrow 52. Such can be accomplished with phase control of microwave radiation emitted from a phased array antenna utilized as the microwave source (14 of FIG. 1).

Figure 4:
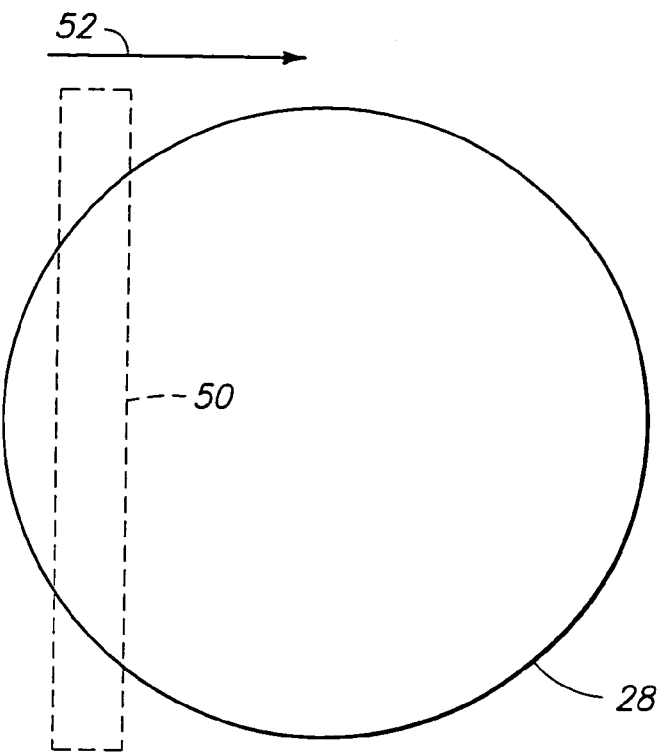
FIG. 4 is a top-view of the FIG. 3 construction, and further illustrates a direction of travel of the microwave beam in accordance with an exemplary aspect of the invention.

FIG. 4 illustrates a top view of the FIG. 3 diagram to further show the linear travel of beam 50 across substrate 28 as well as to illustrate that beam 50 can extend transversely across a full width of substrate 28 (in other words, can extend across a full diameter of the shown circular substrate).

FIGS. 3 and 4 illustrate that microwave radiation emitted into a reaction chamber can be emitted along a first axis (the axes of radiation 16), and swept along a second axis (axis 52), with the second axis of the shown embodiment being substantially perpendicular to the axis along which the radiation is directed. The term "substantially perpendicular" is used to indicate that the axis along which the radiation is swept is perpendicular to the axis along which the radiation is directed within errors of measurement.

In applications in which source 14 (FIG. 1) comprises a phased array antenna, the microwave radiation from such source can be swept across an entirety of a surface of a substrate 28 utilizing methodology of FIG. 4. Alternatively, the radiation can be directed toward an entire surface of substrate 28 by simply simultaneously exposing the whole surface of substrate to microwave radiation.

Figure 5:
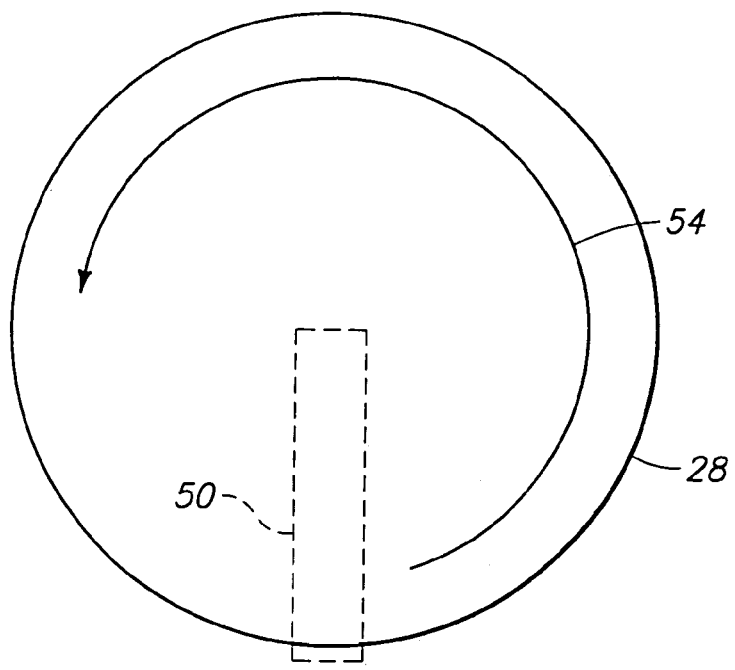
FIG. 5 is a top view of a substrate treated in accordance with an aspect of the present invention, and illustrates another exemplary direction of travel of a beam of microwave radiation in accordance with an aspect of the present invention.

Another method for directing microwave radiation across an entire surface of substrate 28 is shown in FIG. 5. Specifically, the beam 50 of the radiation extends radially from a center of a circular substrate to an edge, and is swept along a rotational axis 54 to cover an entirety of the substrate.

An advantage of having a beam sweep a substrate (as shown in the exemplary embodiments of FIGS. 3, 4 and 5) can be that such can enhance the uniformity of deposition of a material over a substrate during CVD or ALD.

Incorporation of microwave excitation into CVD and/or ALD processes can enable reaction chambers to be formed smaller than those currently available. Smaller chambers can be advantageous in reducing a volume within the reaction chambers, which can particularly assist ALD processes in allowing faster purging of the reaction chambers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A process comprising:
utilizing microwave excitation of a component within a reaction chamber during deposition of a material over a substrate within the reaction chamber; and wherein:
phased array microwave radiation is generated externally of the chamber;
the phased array microwave radiation is passed through a window and into the chamber; and
the microwave excitation results from interaction of the component with the phased array microwave radiation in the reaction chamber.

2. The process of claim 1 further comprising:
flowing a precursor into the reaction chamber; and
reacting the precursor with the microwave excited component to form the material.

3. The process of claim 2 wherein the precursor bonds to the substrate and thereafter reacts with the microwave excited component to form the material deposited on the substrate.

4. The process of claim 2 wherein the precursor reacts with the microwave excited component to form the material which thereafter accumulates on the substrate.

5. The process of claim 1 wherein the component is associated with a surface of the substrate during the microwave excitation.

6. The process of claim 1 wherein the component is not on a surface of the substrate during the microwave excitation.

7. The process of claim 1 wherein the microwave excited component is part of a plasma within the reaction chamber.

8. The process of claim 1 wherein the microwave excited component is selected from the group consisting of H, O and N.

9. The process of claim 1 wherein the material deposited over the substrate comprises a product which includes at least a portion of the microwave excited component.

10. The process of claim 1 wherein the material deposited over the substrate does not comprise the microwave excited component.

11. The process of claim 1 wherein the deposition is chemical vapor deposition.

12. The process of claim 1 wherein the deposition is atomic layer deposition.

13. The process of claim 1 wherein the deposition is atomic layer deposition, the process further comprising:
sequentially pulsing first and second components into the reaction chamber and purging the components from the reaction chamber between the sequential pulses; the microwave excited component being at least one of the first and second components; and
the microwave excitation resulting from pulses of the microwave radiation into the chamber; the pulses of microwave radiation substantially coinciding with the pulses of one or both of the first and second components into the reaction chamber.

14. A deposition method, comprising:
providing an apparatus comprising a reaction chamber and a microwave source external to the chamber; the reaction chamber comprising a window through which microwave radiation can pass;
passing microwaves from the source, through the window, and into the chamber;
placing a substrate within the reaction chamber;
flowing one or more materials within the reaction chamber and through the microwaves;
depositing at least a component of the one or more materials onto the substrate; and
wherein the microwave radiation is phased array microwave radiation associated with a beam that is emitted along a first axis into the chamber and swept along a second axis within the chamber.

15. The method of claim 14 wherein the second axis is a linear axis.

16. The method of claim 14 wherein the second axis is a rotational axis.

17. The method of claim 14 wherein the window comprises quartz, mica or plastic.

18. The method of claim 14 wherein the substrate is a semiconductor substrate.

19. The method of claim 14 wherein the depositing comprises chemical vapor deposition.

20. The method of claim 14 wherein the depositing comprises atomic layer deposition.

21. The method of claim 14 wherein the materials flowed through the microwaves comprise a metal-containing material and oxygen, and wherein the depositing forms an oxide of the metal over the substrate.

22. The method of claim 14 wherein the materials flowed through the microwaves comprise a metal-containing material and nitrogen, and wherein the depositing forms a nitride of the metal over the substrate.

23. The method of claim 14 wherein the materials flowed through the microwaves comprise a metal-containing material and hydrogen, and wherein the depositing forms a film comprising the metal of the metal-containing material over the substrate.

24. The method of claim 14 wherein the materials flowed through the microwaves comprise a titanium-containing material and oxygen, and wherein the depositing forms titanium oxide over the substrate.

25. The method of claim 14 wherein the materials flowed through the microwaves comprise a titanium-containing material and nitrogen, and wherein the depositing forms titanium nitride over the substrate.

26. A deposition method, comprising:
providing an apparatus comprising a reaction chamber and a microwave source external to the chamber; the reaction chamber comprising a window through which microwave radiation can pass;
placing a substrate within the reaction chamber;
flowing one or more one microwave-inducible constituents into the reaction chamber;
flowing one or more precursors into the reaction chamber;
while the substrate and the one or more microwave-inducible constituents are within the reaction chamber, activating at least one of the microwave-inducible constituents with microwave radiation to form at least one activated species;
depositing at least a component of at least one of the one or more precursors onto the substrate;
reacting the at least one of the one or more precursors with the activated species, the reacting occurring at one or more of before, after and during the depositing; and
wherein the microwave source comprises a phased array microwave antenna, and wherein the microwave radiation is phased array microwave radiation.

27. The method of claim 26 wherein the reacting occurs before the depositing.

28. The method of claim 26 wherein the reacting occurs after the depositing.

29. The method of claim 26 wherein the reacting occurs during the depositing.

30. The method of claim 26 wherein the window comprises quartz, mica or plastic.

31. The method of claim 26 wherein the microwave-inducible constituent is selected from the group consisting of O, H, and N.

32. The method of claim 26 wherein the at least one activated species is part of a plasma generated from the microwave radiation.

33. The method of claim 26 wherein:
the microwave-inducible constituent is selected from the group consisting of O, H, and N;
the deposited component comprises fragment of the precursor, but not an entirety of the precursor; and
the fragment is formed when the at least one activated species reacts with the at least one precursor.

34. A deposition method, comprising:
providing an apparatus comprising a reaction chamber and a microwave source external to the chamber; the reaction chamber comprising a window through which microwave radiation can pass;
placing a substrate within the reaction chamber;
flowing one or more one microwave-inducible constituents into the reaction chamber;
flowing one or more precursors into the reaction chamber;
while the substrate and the one or more microwave-inducible constituents are within the reaction chamber, activating at least one of the microwave-inducible constituents with phased array microwave radiation to form at least one activated species;
depositing at least a component of at least one of the one or more precursors onto the substrate;
reacting the at least one of the one or more precursors with the activated species, the reacting occurring at one or more of before, after and during the depositing; and
wherein the microwave source extends across an expanse and generates the microwaves along the expanse, the microwaves along one portion of the expanse being selectively tuned relative to the microwaves along a different portion of the expanse.

35. The method of claim 34 wherein the tuned microwaves form a band of radiation which sweeps across a surface of the substrate during the depositing.

36. A deposition method, comprising:
providing an apparatus comprising a reaction chamber; a microwave source external to the chamber, and an inlet port extending through the microwave source and into the reaction chamber; the reaction chamber comprising a window through which microwave radiation can pass, and the inlet port extending through the window and terminating in an opening under the window; the apparatus further comprising a gas dispersion plate beneath the opening;
passing phased array microwave radiation from the source, through the window, through the dispersion plate, and into the chamber;
placing a substrate within the reaction chamber and under the dispersion plate;
flowing one or more materials through the inlet port, across and through the dispersion plate, and into the reaction chamber; the one or more materials being subjected to the phase array microwave radiation while in the reaction chamber;
depositing at least a component of the one or more materials onto the substrate; and
wherein the microwave source comprises a phased array antenna.

37. The deposition method of claim 36 wherein the window comprises quartz, mica or plastic.

38. The deposition method of claim 36 wherein the window consists essentially of quartz.

39. The deposition method of claim 36 wherein the gas dispersion plate comprises quartz, mica or plastic; and has a plurality of openings extending therethrough.

40. The deposition method of claim 36 wherein the gas dispersion plate consists essentially of quartz having a plurality of openings extending therethrough.

41. The deposition method of claim 36 wherein the window and gas dispersion plate consist essentially of quartz.

42. The deposition method of claim 36 wherein the microwave source extends across an expanse and generates microwaves along the expanse, the microwaves along one portion of the expanse being selectively tuned relative to the microwaves along a different portion of the expanse.

43. The deposition method of claim 36 wherein the microwave source extends across an expanse and generates microwaves along the expanse, the microwaves along one portion of the expanse being selectively tuned relative to the microwaves along a different portion of the expanse; and wherein the tuned microwaves form a band of radiation which sweeps across a surface of the substrate during the depositing.

* * * * *

UNITED STATES PATENT AND TRADEMARK OFFICE
CERTIFICATE OF CORRECTION

PATENT NO. : 7,105,208 B2
APPLICATION NO. : 10/699013
DATED : September 12, 2006
INVENTOR(S) : Craig M. Carpenter It is certified that error appears in the above-identified patent and that said Letters Patent is hereby corrected as shown below:

Col. 1, line 24 –
  Replace "deposition (CVD) and atomic layer deposition (CVD). CVD"
  With --deposition (CVD) and atomic layer deposition (ALD). CVD--

Col. 3, line 10 –
  Replace "in the periodic table, namely, Al, Ga, In, TI, Ge, Sn, Pb, Sb,"
  With -- in the periodic table, namely, Al, Ga, In, Tl, Ge, Sn, Pb, Sb,--

Col. 3, line 64 –
  Replace "forming other than One monolayer at a time by stacking of"
  With -- forming other than one monolayer at a time by stacking of --

Col. 4, line 7 –
  Replace "Traditional ALD can occur within an frequently-used"
  With -- Traditional ALD can occur within frequently-used --

Col. 4, line 23 –
  Replace " CVD is commonly used to form non-selectively a complete,"
  With --CVD is commonly used to form non-selectively complete,--

Signed and Sealed this

Twenty-fourth Day of July, 2007

JON W. DUDAS
*Director of the United States Patent and Trademark Office*